US008560983B2

(12) United States Patent
Brandt et al.

(10) Patent No.: US 8,560,983 B2
(45) Date of Patent: Oct. 15, 2013

(54) INCORPORATING SYNTHESIZED NETLISTS AS SUBCOMPONENTS IN A HIERARCHICAL CUSTOM DESIGN

(75) Inventors: Uwe Brandt, Boeblingen (DE); Thomas M. Makowski, Pfullingen (DE); Christoph Wandel, Weil im Schoebuch (DE); Holger Wetter, Weil im Schoebuch (DE)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 13/312,108

(22) Filed: Dec. 6, 2011

(65) Prior Publication Data
US 2013/0145329 A1    Jun. 6, 2013

(51) Int. Cl.
*G06F 17/50* (2006.01)
(52) U.S. Cl.
USPC ........... 716/104; 716/101; 716/110; 716/116; 716/118; 716/119; 716/139
(58) Field of Classification Search
USPC .......... 716/101, 104, 110, 116, 118, 119, 139
See application file for complete search history.

(56) References Cited

U.S. PATENT DOCUMENTS

| | | | |
|---|---|---|---|
| 5,764,532 A * | 6/1998 | Patel | 716/113 |
| 5,870,308 A | 2/1999 | Dangelo et al. | |
| 7,225,423 B2 | 5/2007 | Bhattacharya et al. | |
| 8,316,335 B2 * | 11/2012 | Barowski et al. | 716/119 |
| 2003/0212967 A1 * | 11/2003 | Halstead | 716/3 |
| 2004/0230924 A1 | 11/2004 | Williams et al. | |
| 2009/0172622 A1 | 7/2009 | Pyapali et al. | |
| 2009/0228849 A1 * | 9/2009 | Mossawir et al. | 716/5 |
| 2009/0288055 A1 * | 11/2009 | Shankar et al. | 716/12 |
| 2010/0031218 A1 | 2/2010 | Ramsour et al. | |
| 2010/0169857 A1 * | 7/2010 | Campi et al. | 716/8 |
| 2012/0151429 A1 * | 6/2012 | Barowski et al. | 716/116 |

OTHER PUBLICATIONS

"White paper: Integration of a data path generation in an ASIC flow", COREUM, http://www.coreum.com/index.php?Itemid=56&id=21 &option=com_content&task=view, 2011, 7 pages.
Dally, William J. et al., "The Role of Custom Design in ASIC Chips", Computer Systems Laboratory Stanford University, http://cva. stanford.edu/publications/2000/dac00.pdf, Aug. 2002, 5 pages.
Northrop, Gregory A. et al., "A Semi-custom Design Flow in High-performance Microprocessor Design", IBM Research, DAC 2001, Jun. 18-22, 2001, 6 pages.

* cited by examiner

*Primary Examiner* — Stacy Whitmore
(74) *Attorney, Agent, or Firm* — Francis Lammes; Stephen J. Walder, Jr.; Matthew W. Baca

(57) ABSTRACT

Mechanisms are provided for generating a physical layout of an integrated circuit design. A logic description of the integrated circuit design is received that comprises a first logic description of an irregular logic block of the integrated circuit design and a second logic description of a regular logic block of the integrated circuit design. A manual design of the regular logic block of the integrated circuit design is performed based on user input and an automated design of the irregular logic block of the integrated circuit design is performed without user input. The manual design of the regular logic block and the automated design of the irregular logic block are then integrated into the integrated circuit design to generate a hybrid integrated circuit design.

21 Claims, 7 Drawing Sheets

INCORPORATING SYNTHESIZED NETLISTS AS SUBCOMPONENTS IN A HIERARCHICAL CUSTOM DESIGN

BACKGROUND

The present application relates generally to an improved data processing apparatus and method and more specifically to mechanisms for incorporating synthesized netlists as subcomponents in a hierarchical custom design of an integrated circuit device.

SUMMARY

In one illustrative embodiment, a method, in a data processing system, is provided for generating a physical layout of an integrated circuit design. The method comprises receiving, by the data processing system, a logic description of the integrated circuit design. The logic description comprises a first logic description of an irregular logic block of the integrated circuit design and a second logic description of a regular logic block of the integrated circuit design. The method further comprises performing, in the data processing system, manual design of the regular logic block of the integrated circuit design based on user input and performing automated design of the irregular logic block of the integrated circuit design without user input. Moreover, the method comprises integrating, by the data processing system, the manual design of the regular logic block and the automated design of the irregular logic block into the integrated circuit design to generate a hybrid integrated circuit design.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
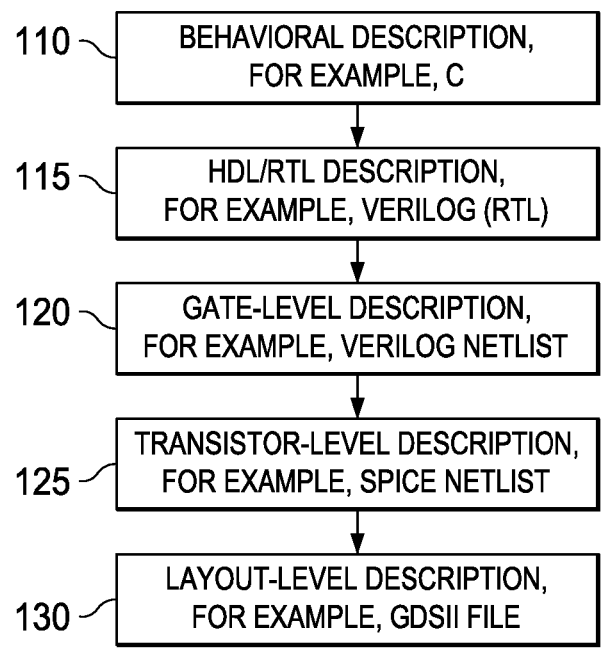
FIG. 1 is an example diagram of a known top-down hierarchical approach to integrated circuit (IC) design.

Various automatic or semi-automatic design methods for integrated circuits (ICs) have been suggested and/or developed in an attempt to provide a cost-efficient IC design process. While such previous attempts at automating the IC design process have resulted in some success with respect to containing the cost of IC designs, the quality of the resultant IC designs are compromised as compared to the quality of full custom, handcrafted designs. Thus, despite previously proposed automated and/or semi-automated IC design processes, there remains a need for an automated IC design process that can dynamically and efficiently yield IC designs that meet specific design objectives for a given IC design.

IC designs may generally be classified according to the type of circuit building blocks or cells used in the IC design process thereof. Broadly speaking, IC design processes can use either design-specific (i.e., custom) building blocks, or generic (i.e., standard) cells that are pre-defined. Standard cells are often provided as part of one or more libraries of such standard cells. A "custom" IC design process refers to the identification and implementation of the IC design by manual effort/human IC designers, often drawing on years of IC design experience.

Often times, at least some of the critical portions of the IC design and the lower levels of design abstraction (e.g., the transistor-level design of blocks) are obtained using manual, custom design processes. The custom design process is labor-intensive, time consuming, and expensive. Custom design processes are prone to design "bugs," e.g., errors introduced by human fault, that result in long design cycle times.

The custom IC design method, however, is typically capable of yielding high quality IC designs well-suited to the design objectives of the IC. This is due to the fact that the implemented IC design is specifically designed, from start to finish, using design-specific circuits and circuit building blocks designed for the subject IC, including all of the design objectives of the IC.

Highly critical logic designs must be performed using custom IC design methods in order to ensure proper timing, placement, and power constraints. This is because automatic, or semi-automatic, tools are not able to meet these constraints using standardized cells and automated placement, routing, timing, and power mechanisms. This is especially true for large or irregular control logic, i.e. irregular logic that is comprised of a large number of single signals linked together. Such irregular control logic is difficult to build manually and requires a large amount of time to obtain good results (as opposed to data path logic that is very regular in structure).

The illustrative embodiments provide a mechanism for automatically incorporating synthesized netlists as schematics into a hierarchical custom design. With the mechanisms of the illustrative embodiments the logic descriptions of various sub-components of an integrated circuit design are input to art automatic custom synthesis engine to automatically generate synthesized netlists for customized blocks/cells of the integrated circuit design and integrate them into the physical layout of the hierarchical integrated circuit design with minimal, if any, manual intervention.

The illustrative embodiments further provide mechanisms for intermixing two completely different design flows. That is, in the current state of the art, one would need to perform a manual custom design operation to generate both irregular logic portions of an integrated circuit design, i.e. portions of an integrated circuit design that are non-repeating in the design such as control logic, as well as the regular logic portions of the integrated circuit design, i.e. portions of an integrated circuit design that are repeating in the design such as datapath logic, and integrate these two separate manual designs by way of a synthesis operation. The manual custom design approach is very ineffective if the design is mostly comprised of data path logic and very few control logic portions. The illustrative embodiments provide a mechanism for synthesizing only small portions of the integrated circuit design and then integrate them into the custom design.

In this context, control logic is logic used to control larger parts of the circuit such as a state machine, decision logic that feeds a selector, etc. Data path logic is logic that implements the same function on many parallel running signals in the same or similar way and may be controlled by control logic. An example of data path logic is a multiplexer for data streaming that consists of logic switches for the data (data path logic) and less regular control circuits to select one or the other inputs (control logic). Furthermore, examples of irregular logic include encryption table logic, error detection and correction (ECC) logic for data streams, and the like. Examples of regular logic may comprise, for example, a data part portion of a 64 bit multiplexer. Custom logic is all logic that cannot be built by automated synthesis tools and instead is built manually.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

With reference now to the figures, FIG. 1 is an example of a known top-down hierarchical approach to integrated circuit (IC) design. As shown in FIG. 1, the description of the function to be performed by the IC is specified in, for example, the C programming language or the like (step 110). The description is expressed in a Hardware Description Language (HDL) in a manner that is largely independent of the physical design of the IC function (step 115). Verilog and VHDL are examples of suitable languages for specifying the description of the IC design.

Using the HDI, description, a gate-level representation of the IC design is made (step 120). The gate-level representation of the IC design is then expanded to describe the IC design at the transistor-level (step 125). An automated circuit modeling and capture application, such as SPICE, for example, can be used to evaluate the transistor-level representation of the IC design (step 130). The next step in the top-down approach is the layout of the described and designed IC device (step 135). The layout-level description is preferably in a format adept at describing graphical representations, such as, for example, Graphic Design System II (GD-SII) or OASIS.

Although the top-down hierarchical approach theoretically provides excellent IC design process control, the IC design process rarely progresses in a strict top-down manner. In practice, both the top-down and a bottom-up design flow are used because the IC design process often involves iterations progressing from top-down and bottom-up in an attempt to meet the IC specifications. For example, if a system designer specifies an architecture (i.e., a top-level description) without an accurate estimate of the corresponding circuit area (i.e., a bottom level description), then it is highly probable that the resultant IC layout will exceed the maximum area permitted for the IC design. In this example, in order to meet the allowable maximum area constraint, certain functions of the design may have to be removed from the design (e.g., a repartitioning of the system) and the design process repeated until an IC design having an acceptable circuit area is achieved.

As mentioned above, the manual, full custom approach to designing ICs is prone to error. A hierarchical, manual design process is especially vulnerable to the introduction of errors at the layout stage where the detailed information describing the design is the greatest and thus, most complex. However, for very complex yet high-volume circuits such as microprocessors and the like, there is a need to efficiently use every square micron of the silicon comprising the IC design in order to achieve the maximum yield at the minimum cost. In such cases, manual design processes are often applied to major parts of the circuit, e.g., critical or control logic blocks/cells, to achieve maximum use of the IC silicon.

Figure 2:
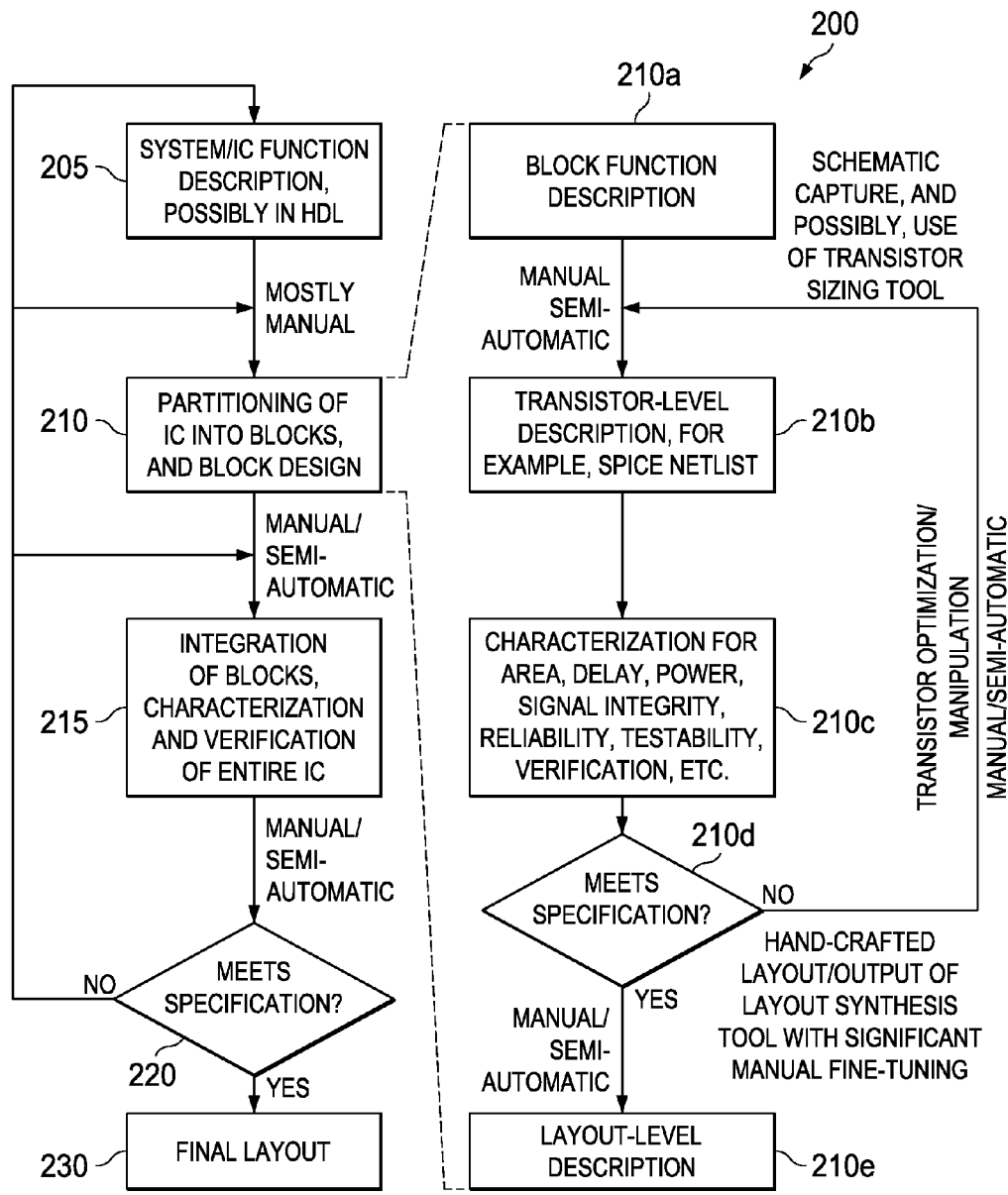
FIG. 2 illustrates a fully customized IC design process flow in accordance with one known methodology.

FIG. 2 illustrates a fully customized IC design process flow in accordance with one known methodology. As shown in FIG. 2, the full-custom methodology 200 starts with a system/IC function description (step 205). The IC design is then partitioned into functional blocks (step 210). As shown in steps 210a-210e, the partitioned blocks are further described and implemented using a top-down hierarchical approach. The blocks are described using manual or semiautomatic toots to capture and describe the transistor-level representation of the functional blocks (step 210b). This design step typically includes pN-layout transistor-level simulation using simulators such as SPICE. This is typically a labor-intensive and time-consuming manual process. Beyond this stage, some design tool assistance is usually employed to complete the system description. Layout design tools or other automatic/semi-automatic tools for implementing transistor layouts based on a transistor netlist representation may be used to complete the transistor-level description of the system.

The functional blocks are characterized to verify and characterize the implemented design in terms of conventional metrics, such as layout design rules, delay, power, signal integrity, testability, area, signal, power dissipation, reliability, testability, and other verifiable constraints (step 210c). It is determined whether the functional blocks meet the specifications of the target IC design (step 210d). If it is determined that the functional blocks satisfactorily meet the specifications for the IC design, then a layout description for the functional circuit block is generated (step 210e). The process typically iterates until the design constraints are satisfied. The verification and characterization step is usually invoked in order to accurately understand the behavior of the implemented circuit (especially timing behavior) and to provide assurances that the design can be manufactured reliably.

The IC design then proceeds with integrating the circuit blocks (step 215). The IC design is verified and it is determined whether the proposed design meets the specifications for the design (step 220). As shown, the design process can iterate until the resultant design meets the required specifications. Once the IC design meets the specifications, the final layout of the IC design can commence (step 230).

Full-custom design processes are particularly useful where portions of the target IC design repeat often, and for blocks that are in the critically important portions of the design. Under such circumstances, the time and expense required for a full, custom design are justified by the high quality results of full custom IC design. For example, full, custom designs are used for memory cell designs, arithmetic block/datapath designs, etc.

While full-custom design processes may be used for the critical cells or logic of an IC design, such as control blocks/cells or the like, it would still be beneficial to provide a mechanism for minimizing or eliminating the manual work required to provide such control block/cell design portions of an IC design. Not only would this eliminate the extra time and expense required to have a trained/experienced person manually customize the control blocks/cells, but it would also reduce the likelihood of human introduced error into the IC design which in turn further reduces the time and cost associated with generating the final IC design by eliminating the need for extensive checking and fixing of the IC design. The illustrative embodiments set forth herein provide mechanisms for automating the creation and integration of control blocks/cells (referred to hereafter as "control logic") of an IC design into the overall IC design thereby eliminating the drawbacks associated with manual intervention.

Figure 3:
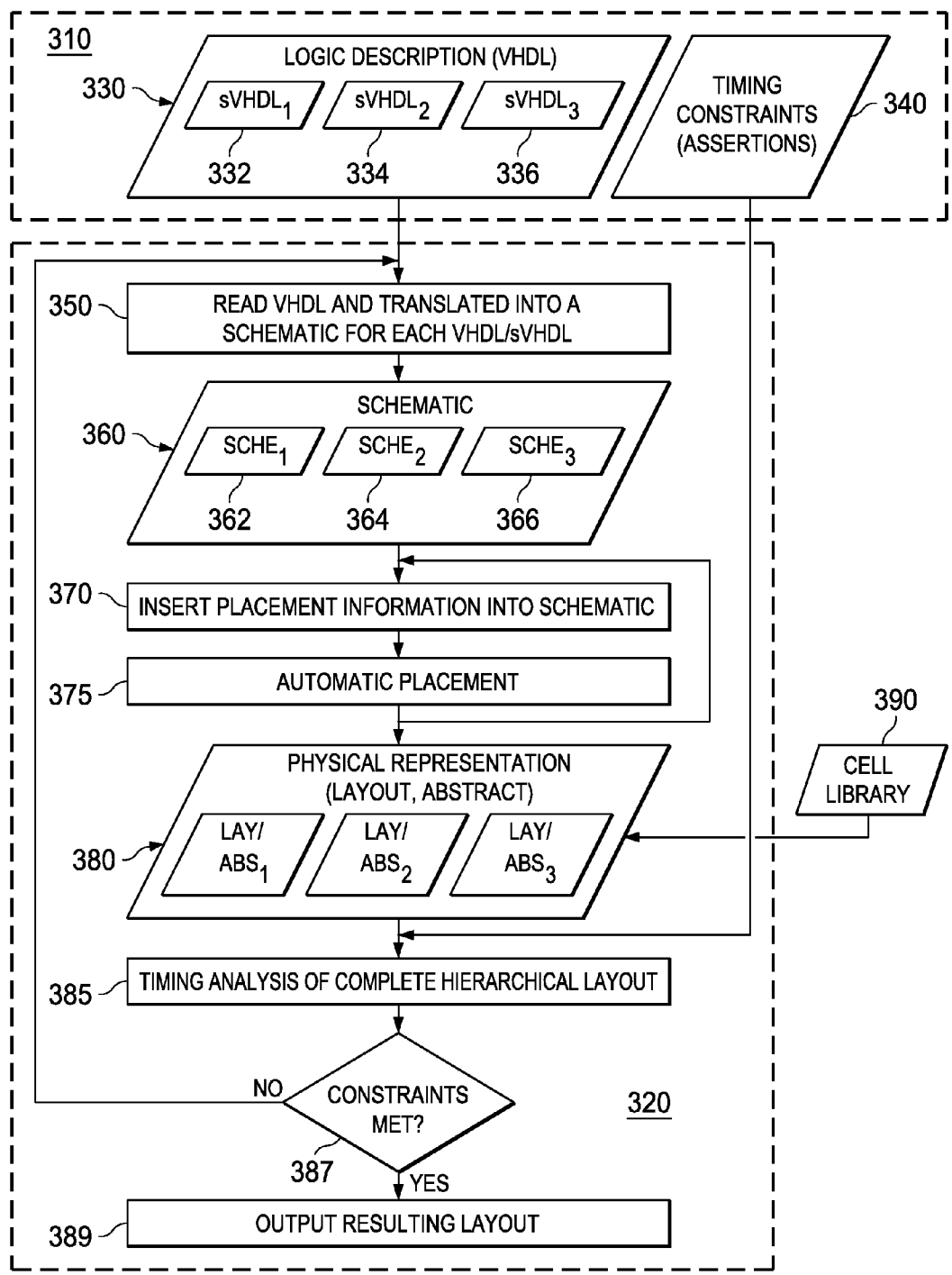
FIG. 3 is an example diagram of a custom IC design flow for purposes of illustrating the improvements made by the illustrative embodiments.

To better understand the improvements to known custom integrated circuit (IC) design processes provided by the illustrative embodiments, FIG. 3 is provided as an example diagram of a custom IC design flow similar to that of FIG. 2 but with additional details provided. As shown in FIG. 3, the custom IC design process involves providing a set of inputs 310 to a synthesis and layout engine 320 which generates a hierarchical physical layout of the IC design. In the depicted example, the inputs 310 comprise a logic description 330, which may be provided, for example, as a hierarchical very high speed integrated circuit (VHSIC) hardware description language (HDL) model of the IC device. While a VHDL model will be used in the examples described herein to represent the logic description 330, it should be appreciated that the use of VHDL is not required for implementing the mechanisms of the illustrative embodiments. To the contrary other types of logic descriptions may be used including Verilog, the C programming language, and the like.

This logic description, or VHDL, 330 of the IC device may be partitioned into separate sub-components 332-336, e.g., sVHDLs, representing sub-blocks or instances of cells of the VHDL 330. For example, the partitioning may be performed using the operation outlined in FIG. 2 with regard to step 210. The result of this partitioning is a VHDL 330 in which blocks/cells 332-336 are extracted from the original VHDL 330 into sub-components or sVHDLs 332-336. Thus, the logic description 330 comprises the top-level VHDL 330 with the non-custom VHDL descriptions, and the blocks/cells or sVHDLs 332-336, all of which are to be synthesized by the synthesis and layout engine 320.

Another input 310 provided in the custom IC design flow is timing constraints (assertions) 340 which specify the required timing conditions of the IC design, as is generally known in the art. These timing constraints 340, or assertions, are used during timing analysis of the synthesized IC design to ensure that the resulting synthesized IC design exhibits the timing behavior desired. The timing constraints 340 may be specified, for example, from a default value that sets the initial timing constraints 340 which are then updated with calculated timing constraints matching the physical realities of the integrated circuit design, as a result of the timing analysis 385.

With these inputs 310, the synthesis and layout engine 320 operates on the logic description 330 to translate the logic description 330 (hereafter referred to as VHDL 330) into a schematic for each sub-component 332-336 (hereafter referred to as sVHDL 332-336). That is, each sVHDL 332-336 is read from the VHDL 330 (350) and a corresponding schematic is manually built for the sVHDL 332-336 (360) by the designer. The schematics are equivalent netlists of the VHDL or sVHDL and are technology mapped gate level equivalents to the VHDL 330 and its sVHDLs 332-336. Schematics are built with cells from a cell library 390, which may include custom generated cells. The cell library 390 may be generated manually for each technology prior to the actual use of the cell library in the integrated circuit design operation. Cells may be manually selected from the cell library 390 by a designer who knows the functionality of each cell in the library and can use them to create the custom design of the sVHDLs 332-336 of the VHDL 330.

Once the VHDL 330 is translated into a schematic 360, which may include manually generated schematics 362-366 for each of the sVHDLs 332-336, placement information is manually inserted on all cells in the schematic 360 by the designer (370). That is, placement attributes are placed on each of the cells in the schematic 360, including the schematics 362-366 for each of the sub-components or sVHDLs 332-336. An automatic placement algorithm (375) is then executed to generate a physical representation of the schematic 360 based on the placement attributes inserted into the schematic 360. The physical representation 380 that is generated by the automatic placement algorithm 375 is comprised of layouts and abstracts. A layout is the complete view of the physical part of the integrated circuit design. The abstract is only a part of the data of the layout and serves as a placeholder for the layout for tools that need only pin locations and area.

The physical representation 380 includes the layouts and abstracts for each of the schematics 362-366 of the sVHDLs 332-336. The physical representation 380 is then analyzed using timing analysis engine 385 to ensure that the timing constraints 340 are satisfied by the physical representation 380 of the IC design. If the timing constraints 340 are met (387), then the process terminates. Otherwise, if the timing constraints 340 are not met (387), then the process is repeated.

It should be appreciated that the majority of the operations set forth in FIGS. 2 and 3 with regard to extracting the custom sVHDLs, generating the schematics for the sVHDLs, generating the custom cells of the library, inserting placement information into schematics of custom sVHDLs, and the like, are manually performed by a person or persons with a large amount of knowledge of the IC design process and the particular IC design that is the subject of the IC design process. Because of this manual process, errors may often be introduced into the process due to human error. This causes additional expense and time in performing the IC design process since it will cause the process to be repeated until the errors are resolved. Moreover, the requirement for trained personnel itself increases costs as well as time since humans tend to work slower than automated mechanisms and require additional costs to perform their duties.

To defray some of the additional costs and time required by manual processes, the illustrative embodiments provide mechanisms for automating much of the custom block synthesis, placement, and integration operations of a custom IC design process flow. With the mechanisms of the illustrative embodiments, the known IC design process is followed for the portions of the logic description that do not correspond to control logic while, in a parallel operation or as a later step, automatic synthesis, placement, and integration are performed for the control logic portions of the integrated circuit design. The result is that the automatically generated control logic layouts are integrated automatically into the physical representation of the overall IC design.

Figure 4:
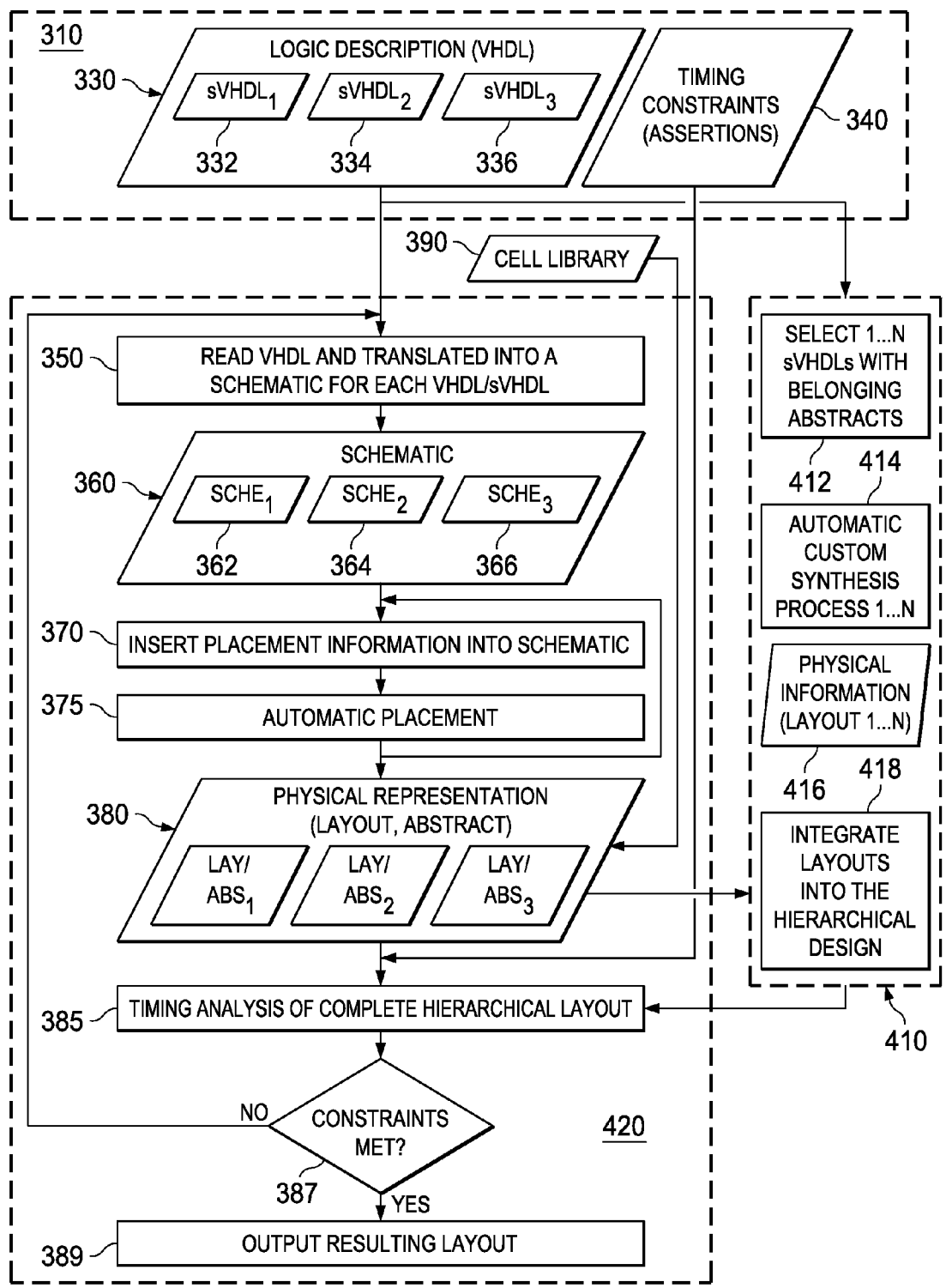
FIG. 4 is an example diagram of a custom IC design flow in accordance with one illustrative embodiment.

FIG. 4 is an example diagram of a custom IC design flow in accordance with one illustrative embodiment. Many of the operations shown in FIG. 4 are similar to that of FIG. 3 above and thus, are given similar reference numerals. However, it should be appreciated that, with the illustrative embodiments, these operations are performed on the top level logic description and are not performed on the individual sVHDLs 332-336 which are still part of the logic description 330 but are not extracted from the logic description 330 at this point.

As is done in the process outlined in FIG. 3 above, the VHDL 330 is translated into a schematic representation 360 by the synthesis and layout engine 420 using cells from the cell library 390. This includes generating schematics 362-366 for the sVHDLs 332-336, however these schematics 362-366 are generated as a whole as part of the synthesis of the logic description 330 as a whole without specifically extracting the sVHDLs 332-336. The translation of the VHDL 330 into a schematic representation 360 may be a manual process.

As with the process outlined in FIG. 3 above, placement information is then inserted into the schematic 360 (370). This again may be a manual process in which the placement parameters arc added by the designer. An automated placement operation is then performed (375) to generate a physical representation of the IC design including the layouts and abstracts of the logic description 330 as a whole which itself includes layout and abstract information for each of the sVHDLs 332-336.

At this point, the mechanisms of the illustrative embodiments are utilized to automate the synthesis, layout, and insertion of netlists for the control logic of the logic description 330 into the physical representation of the logic description 330. The automated control logic synthesis and layout engine 410 selects the sVHDLs of the logic description 330 that correspond to control logic for which automated control logic synthesis is to be performed (412). This may be done, for example, using a manual process in which a designer identifies the sVHDLs 332-336 corresponding to control logic or may be an automated process in which the sVHDLs 332-336 characteristics are analyzed to determine which of the sVHDLs 332-336 represent irregular logic (non-repeating logic blocks/cells) and which represent regular logic (repeating logic blocks/cells). Thus, the sVHDLs 332-336 may comprise two different kinds of sVHDLs 332-336: those that correspond to regular logic (e.g., datapath logic) and those that correspond to irregular logic (e.g., control logic). The control logic sVHDLs 332-336 are identified and selected for automated synthesis and layout to generate placement and wiring information driven by assertions/timing constraints. The sVHDLs 332-336 that correspond to regular logic having their synthesis and layout performed using a manual custom process.

As input to the automated control logic synthesis and layout engine 410, the original sVHDL descriptions 332-336 extracted from the original logic description 330 are retrieved and used as input along with the belonging abstracts to definition of the connections and the area of the physical design of the sVHDL) of the sVHDLs 332-336 extracted from the physical representation generated using the known IC design process on the whole logic description 330. A further input of the layouts of the non-custom components of the logic description 330 are also provided to the automated control logic synthesis and layout engine 410. These inputs are used by the automated control logic synthesis and layout engine 410 to perform automatic synthesis on the selected sVHDLs (414) in a manner to be described in greater detail hereafter. The automatic synthesis of the selected sVHDLs generates a physical layout 416 for these selected sVHDLs which is then integrated into the hierarchical physical representation generated using the known IC design process flow (418). The resulting physical representation is then subjected to timing analysis (385) busing the timing constraints 340 as a basis upon which to determine whether the resulting physical representation meets timing criteria (387). If the timing criteria are met (387), then the operation terminates. Otherwise (387), the operation is repeated (350).

Thus, with the illustrative embodiments, after the generation of the initial physical representation of the logic description 330 from a whole logic description 330 viewpoint, additional mechanisms are provided to perform automated synthesis of the control logic represented by selected sVHDLs 332-336 and their corresponding schematics. Thus, the known process is used to generate the layout of the control logic of the logic description 330 and the belonging abstracts for the control logic of the logic description 330. Thereafter, the mechanisms of the illustrative embodiments are used to generate the layout of the control logic of the logic description 330 and integrate these layouts into the physical representation of the logic description 330 which includes the layouts of the custom designed blocks/cells, i.e. the regular logic such as datapath logic or the like.

Thus, the illustrative embodiments provide a hybrid approach in which regular logic, such as datapath logic, is designed using a manual approach while the non-regular logic, such as control logic, is designed using an automated synthesis and layout engine 410. It has been found that for regular logic, a manual approach to design achieves better results than attempting to utilize an automated tool while, with control logic or other non-regular (irregular) logic, an automated synthesis tool provides improved results. Hence, the illustrative embodiments leverage the benefits of both approaches in a hybrid manual/automated synthesis and layout mechanism.

Figure 5A:
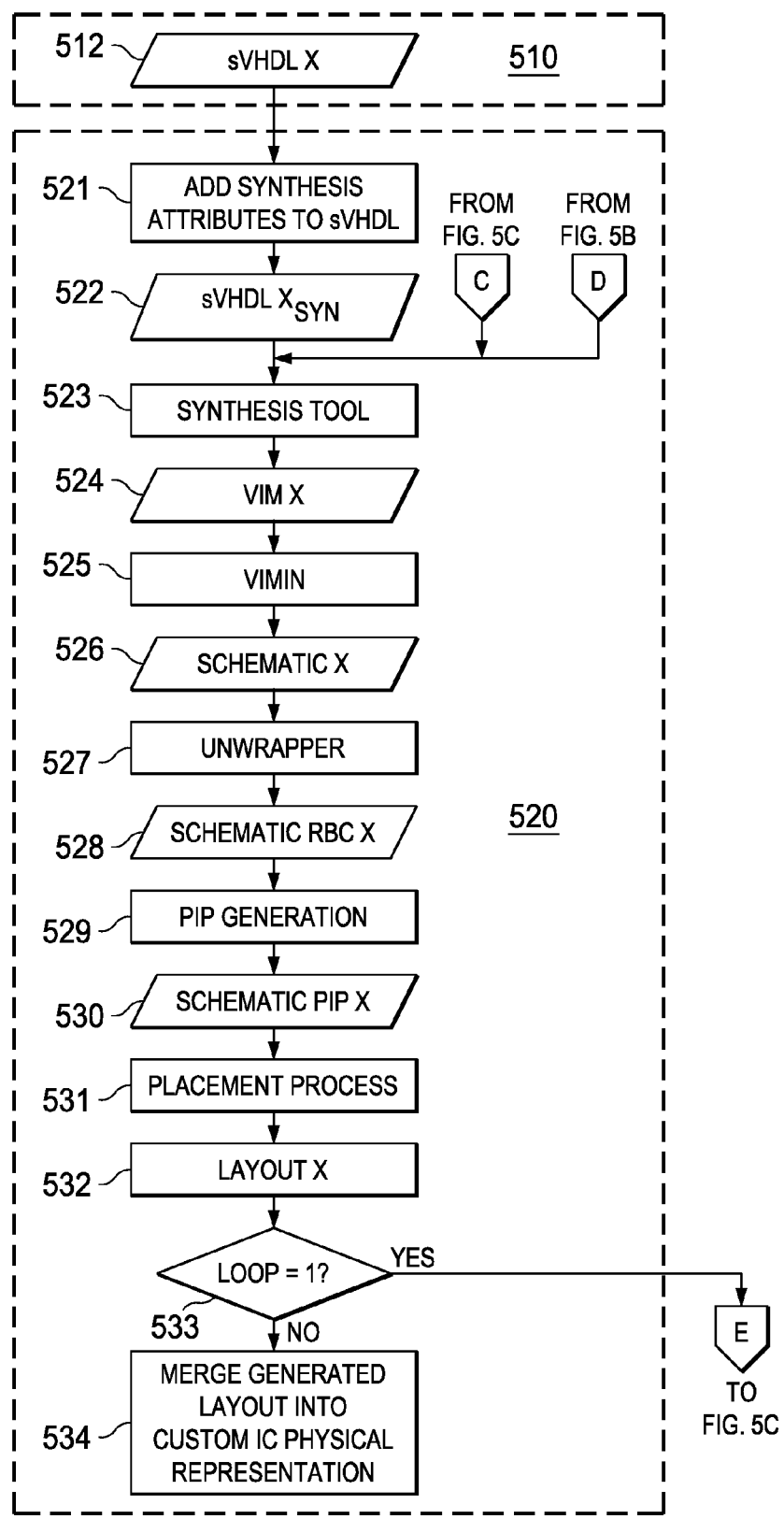
FIGS. 5A-5C illustrate an example diagram of an operation of an automated control logic synthesis and layout mechanism in accordance with one illustrative embodiment.
Figure 5B:
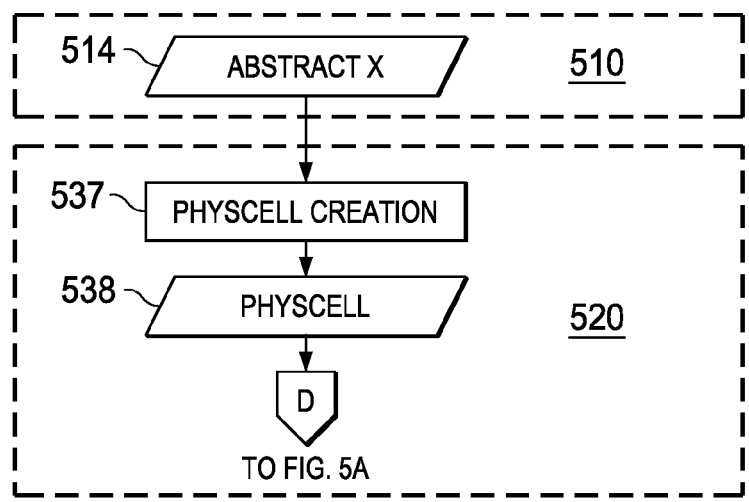
Figure 5C:
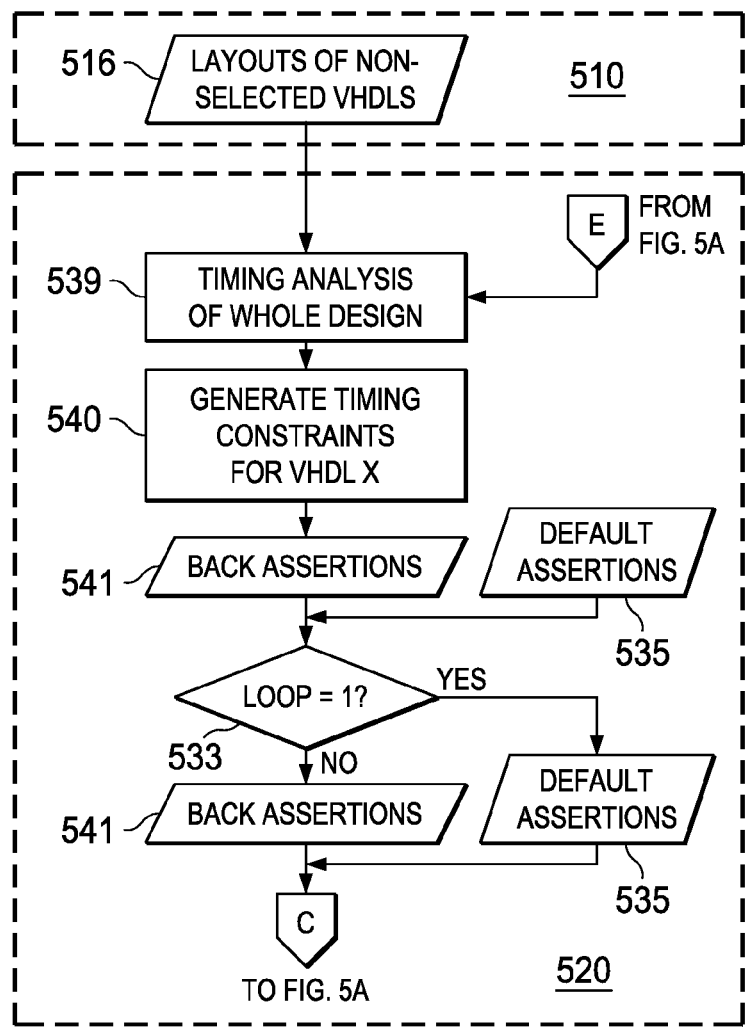

FIGS. 5A-5C illustrate an example diagram of an automated control logic synthesis and layout mechanism in accordance with one illustrative embodiment. The process shown in FIGS. 5A-5C may be performed, for example, by the automated control logic synthesis and layout engine 410 of FIG. 4 as part of the automatic control logic synthesis and integration processes 414 and 418. The process of FIGS. 5A-5C may be implemented using one or more software programs executing on general or special purpose hardware devices, one or more dedicated hardware devices themselves, or any combination of one or more software programs executed on general or special purpose hardware device and one or more dedicated hardware devices. In one illustrative embodiment, the processes shown in FIGS. 5A-5C are implemented using one or more software programs executing on a one or more general or special purpose hardware devices, such as a computing device, set of computing devices, distributed network based data processing system, or the like.

Furthermore, it should be noted that the operation shown in FIGS. 5A-5C is described in terms of one control logic sub-component, e.g., sVHDL, of the logic description. However, the illustrative embodiments are not limited to such. To the contrary, the operation outlined in FIGS. 5A-5C may be performed with regard to any number of custom sub-components or sVHDLs. Moreover, if applied to a plurality of custom sub-components or sVHDLs, the operation outlined in FIGS. 5A-5C may be performed either sequentially or in parallel with regard to each of these sub-components or sVHDLs.

As shown in FIGS. 5A-5C, the automated control logic synthesis and layout engine 520 receives as inputs 510 the sub-component, or sVHDL, logic description 512, the abstract 514 for the sub-component generated by the known IC design process, and the layouts of the non-selected sVHDLs which includes the sVHDL descriptions of the regular logic (e.g., datapath) blocks/cells of the logic description. The abstract 514 includes the correct size of the regular logic (e.g., datapath) block/cell and the starting pin positions of the regular logic block/cell (the pin positions may be changed during synthesis but the abstract specifies the starting pin positions). The layouts for the non-selected VHDLs are used to calculate the overall timing of the resulting physical representation of the IC design.

These inputs are provided to the automated control logic synthesis and layout engine 520 which performs three inter-related and parallel operations on these inputs. FIG. 5A illustrates the operation performed on the logic description of the sub-component, e.g., the sVHDL, 512. FIG. 5B illustrates the operation performed on the abstract of the sub-component 514. FIG. 5C illustrates the operation performed on the layouts of the non-selected VHDLs 516. These operations are interrelated as specified by the connectors A-C in these figures.

As shown in FIG. 5A, the operation on the sVHDL input 512 starts by adding synthesis attributes to the sVHDL 521 so that synthesis can be performed on the sVHDL to generate a sVHDL synthesis output. Such synthesis attributes may be specific to the particular synthesis tool being utilized and thus, are implementation dependent. Examples of synthesis attributes may be include attributes specifying a pin default power domain, a pin default ground domain, power pin attributes, ground pin attributes, and the like. The result of the addition of synthesis attributes to the sVHDL 512 is a sVHDL $X_{syn}$ logic description 522 that is input to a synthesis tool 523 to perform synthesis on the sVHDL Xsyn logic description 522.

The synthesis tool 523 operates on the VHDL Xsyn logic description 522 based on assertions, ie. timing constraints (default or hack assertions as described hereafter), and a physical cell (physcell) generated by a physical cell creation tool 535 operating on the abstract input 514 as described hereafter. The synthesis tool 523 translates the sVHDLs into gates from a cell library and places them so as to meet the timing constraints resulting in a placed and, if possible, a timing closed layout. The result of the synthesis performed by the synthesis tool 523 is a translation of the layout, referred to as the VIM x 524. VIMx refers to a specific type of layout particular to one implementation utilized by International Business Machines Corporation and is not intended to be limiting on the types translations that the illustrative embodiments may be employed to generate. The VIM x 524 is translated, by a translation engine, referred to as the VIMIN 525, into an industry standard schematic with placement coordinates as attributes, resulting in schematic x 526. Again, VIMIN 525 is particular to one implementation of the illustrative embodiments specific to International Business Machines Corporation and is not intended to be limiting on the illustrative embodiments. In some illustrative embodiments, the synthesis tool may generate an industry standard translation itself and the need for a translation engine, such as VIMIN 525 may not be necessary.

An unwrapper tool 527 operates on the schematic x 526 to translate standard library cells of the schematic x 536 into tunable RBC library cells, thereby generating schematic RBC x 528. That is, in one illustrative embodiment, there are two libraries of cells that may be utilized, a custom library for a custom design process, i.e. the manual design process of the regular (e.g. datapath) logic, and a synthesis library for the automated synthesis operation performed on the irregular (e.g., control path) logic. The synthesis library is created from the custom library, which is also referred to as the RBC library. A wrapper is provided around the schematic for the regular logic for the synthesis library. For translation purposes between the two libraries, this wrapper is either created or removed.

The schematic RBC x 528 is input to a placement generation tool 529, which in one illustrative embodiment is a Placement by Instance Properties (PIP) generation tool available from International Business Machines Corporation of Armonk, N.Y., which operates on the schematic RBC x 528 to create placement attributes, or PIP attributes, in the schematic from the placement coordinate attributes. That is, each cell in a design is assigned a placement coordinate as a parameter. From the schematic with these placement coordinate parameters, the placement generation tool 529 creates a placement solution. The cells in the schematic may be from either of the custom (RBC) library or the synthesis library. The PIP attributes may be generated using a string search and replace operation on data already present in the schematic so as to format the data for use by the placement generation tool 529. The result is a ready to use annotated schematic 530, which in one illustrative embodiments is a PIPed schematic 530, which is input to a placement tool 531, such as the PIP tool in one illustrative embodiment, to perform placement operations to get a layout for the sVHDL. That is, from the annotated schematic 530 having the placement attributes, the layout for the full macro can be generated.

The placement tool 531 operates on the annotated schematic 530 to perrm placement operations that result in the generation of a layout 512. A determination is made as to whether this is the first loop of the process for generating the layout (step 533). If so, the operation branches to the operation shown in F*igure* 5C described hereafter. If not, i.e. the loop is the second loop of the process performed to ensure that timing constraints are met, then the generated layout is merged into the custom layout for the VHDL, ie. integrated into the physical representation of the overall IC design represented by the logic description 330. Thereafter, timing analysis may be performed on the integrated physical representation as shown in step 385 of FIG. 4, for example.

FIG. 5B illustrates the operation being performed on the abstract 514 of the selected sVHDLs. As shown in FIG. 5B, the operation starts with a physical cell creation tool 537 receiving the abstract 514 as input. The physical cell creation tool 537 operates on the abstract 514 to generate a physical cell 538 that is provided as input to the synthesis tool 523 in FIG. 5A by translating the abstract 514 into a format useable by the automated synthesis mechanisms of the illustrative embodiments. The physical cell (or physcell) 538 defines the area and the input/output connections for synthesis. The physcell 538 is essentially the empty starting point for obtaining a translated layout, e.g., a VIM.

FIG. 5C illustrates the operation being performed on the layouts of the non-selected VHDLs of the logic description. As shown in FIG. 5C, the layouts of the non-selected VHDLs 516 are input to a timing analysis tool 539 to perform timing analysis of the whole IC design, represented by the physical representation for example, to generate back assertions for the sVHDL x. The timing analysis tool 539 generates timing constraints for the sVHDL x 512, where the timing constraints are obtained from timing constraints generated for the entire overall design (540). The way in which these timing constraints are obtained comprises a first step of creating timing constraints with default values 535 for arrival times, slews, required arrival times, and load capacitances for a first iteration of the operation. Thereafter, synthesis will try to match these constraints for the piece of logic that represents sVHL x. Then, the differences between the required arrival times and the achieved arrival times are calculated in step 539 and also back-translated to the inputs of the RLM that represents sVHDL x (back assertions). Finally, synthesis is invoked again and will now meet the timing requirements, otherwise the VHDL should be revised. In this way, step 539 builds a correction to the default values of the timing constraints using the results of synthesis.

Thus, from the timing constraints, the timing analysis tool 539 generates back assertions 541. Back assertions are timing constraints determined from actual calculated arrival (for inputs) and required arrival times (for outputs) determined from a timing calculated design. That is, the default assertions or timing constraints are assumptions for signal arrivals and required signal arrival times calculated from cycle time. Back assertions are real calculated arrival and required arrival times obtained from a timing calculated design. Thus, during an initial operation, the default assertions are used just to obtain a design to get timing information. After the real timing is known, the synthesis can be done using the real timing information, i.e. the back assertions, to ensure that the design meets the real timing constraints. While the synthesis needs to be run at least twice, once using default assertions and once using back assertions, in both cases the synthesis is performed automatically and no manual interaction is necessary.

A determination is made as to whether the loop being executed in the process outlined in FIG. 5A is a first loop of the process or not 536. As discussed above, the first loop of the process in FIG. 5A is intended to provide an initial layout of the sVHDL x that may or may not conform to the timing constraints 340 in FIG. 4. A second loop of the process is used along with the back assertions generated by the timing analysis of the whole design to ensure that the layout of the sVHDL x 512 conforms with the timing constraints 340.

If it is determined that the loop that is being executed is the first loop on the sVHDL x 512, then default assertions 535 are created and utilized by providing them as input to the synthesis tool 523 in FIG. 5A. Otherwise, if this is the second loop of the process, and thus timing must be assured in this loop, the back assertions 541 generated by the timing analysis tool 539 are input to the synthesis tool 523 for use in performing synthesis and generating VIM x 524. It should be noted that the operation of the timing analysis tool 539 to generate back assertions may be initiated from step 533 in FIG. 5A if the loop that has been executed was the first loop of the process on sVHDL x 512.

Thus, the illustrative embodiments provide a mechanism by which automated control logic synthesis and integration into a physical representation of an IC design is made possible. The mechanisms of the illustrative embodiments eliminate the manual operations required to integrate control logic into an IC design thereby making the synthesis, layout, and integration of such control logic less time consuming, less costly, and less prone to errors introduced by human sources. Moreover, the resulting physical representation of the IC design is correct by construction which eliminates the need to perform checking of the physical design or fixing of the physical design as is required in the manual approach. Furthermore, the control logic does not need to be split and processed as single macros to be able to have them incorporated into the synthesis and then performing the synthesis as a random logic macro (RLM). Moreover, the mechanisms of the illustrative embodiments may be fully integrated into the standard or known IC design flow for custom IC designs as shown in FIG. 4 allowing known custom IC design tools to be utilized with the mechanisms of the illustrative embodiments.

Figure 6:
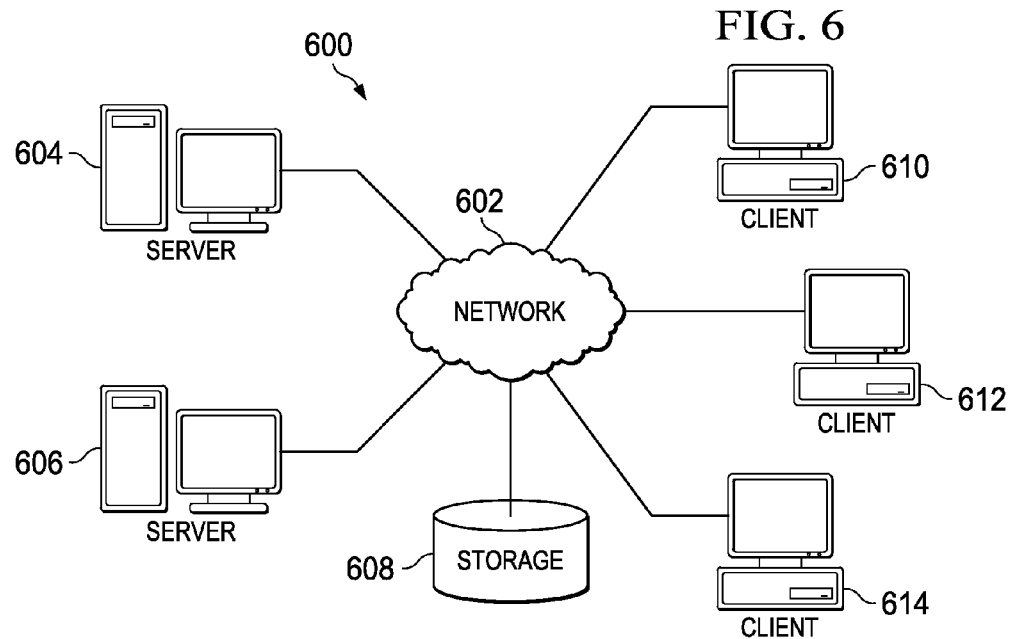
FIG. 6 is an example diagram of a distributed data processing system in which the illustrative embodiments may be implemented.
Figure 7:
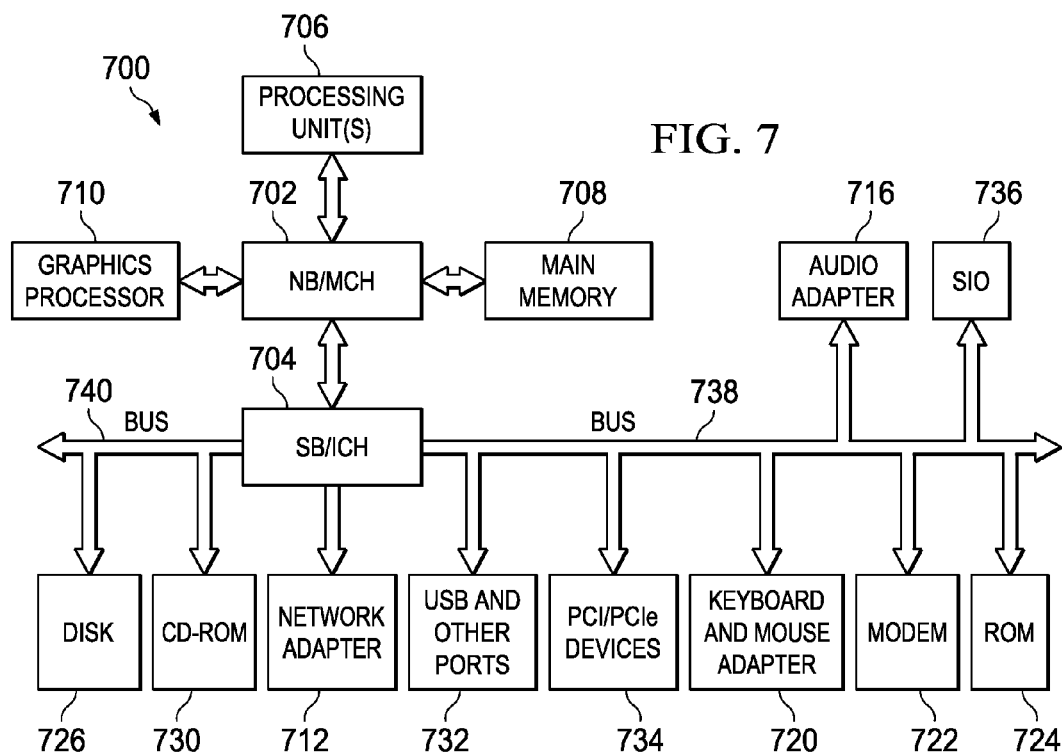
FIG. 7 is an example diagram of a computing device in which example aspects of the illustrative embodiments may be implemented.

The improved custom IC design process in accordance with the illustrative embodiments described above may be implemented in many different types of data processing environments including a distributed data processing environment, a single data processing device, or the like. FIGS. 6 and 7 are provided hereafter as example environments in which aspects of the illustrative embodiments may be implemented. It should be appreciated that FIGS. 6-7 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 6 depicts a pictorial representation of an example distributed data processing system in which aspects of the illustrative embodiments may be implemented. Distributed data processing system 600 may include a network of computers in which aspects of the illustrative embodiments may be implemented. The distributed data processing system 600 contains at least one network 602, which is the medium used to provide communication links between various devices and computers connected together within distributed data processing system 600. The network 602 may include connections, such as wire, wireless communication links, or fiber optic cables.

In the depicted example, server 604 and server 606 are connected to network 602 along with storage unit 608. In addition, clients 610, 612, and 614 are also connected to network 602. These clients 610, 612, and 614 may be, for example, personal computers, network computers, or the like. In the depicted example, server 604 provides data, such as boot files, operating system images, and applications to the clients 610, 612, and 614. Clients 610, 612, and 614 are clients to server 604 in the depicted example. Distributed data processing system 600 may include additional servers, clients, and other devices not shown.

In the depicted example, distributed data processing system 600 is the Internet with network 602 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 600 may also be implemented to include a number of different types of networks, such as for example, an intranet, a local area network (LAN), a wide area network (WAN), or the like. As stated above, FIG. 6 is intended as an example, not as an architectural limitation for different embodiments of the present invention, and therefore, the particular elements shown in FIG. 6 should not be considered limiting with regard to the environments in which the illustrative embodiments of the present invention may he implemented.

With regard to the mechanisms of the illustrative embodiments, in one example embodiment, the synthesis and layout engines 410 and 420 in FIG. 4 may be implemented, for example, on one or more of servers 604 and 606. User input with regard to the logic description 330, timing constraints 340, or other inputs to the synthesis and layout engines 410 and 420 may be provided by one or more users via their corresponding one or more client computing devices 610, 612, and 614 and the one or more networks 602. Results of the operation of the mechanisms of the illustrative embodiments may likewise be provided to the users via their computing devices 610, 612, and 614 and network(s) 602 from server(s) 604 and 606, for example. The data for defining the logic description 330, the timing constraints 340, and other inputs to the synthesis and layout engines 410 and 420 may also be provided via the network attached storage 608, storage devices associated with the servers 604 and 606 (not shown), or the like. Similarly, the results generated by the mechanisms of the illustrative embodiments may be stored in such storage devices or network attached storage 608, for example.

With reference now to FIG. 7, a block diagram of an example data processing system is shown in which aspects of the illustrative embodiments may be implemented. Data processing system 700 is an example of a computer, such as client 610 in FIG. 6, in which computer usable code or instructions implementing the processes for illustrative embodiments of the present invention may be located.

In the depicted example, data processing system 700 employs a hub architecture including north bridge and memory controller hub (NB/MCH) 702 and south bridge and input/output (I/O) controller hub (SB/ICH) 704. Processing unit 706, main memory 708, and graphics processor 710 are connected to NB/MCH 702. Graphics processor 710 may be connected to NB/MCH 702 through an accelerated graphics port (AGP).

In the depicted example, local area network (LAN) adapter 712 connects to SB/ICH 704. Audio adapter 716, keyboard and mouse adapter 720, modem 722, read only memory (ROM) 724, hard disk drive (HDD) 726, CD-ROM drive 230, universal serial bus (USB) ports and other communication ports 732, and PCI/PCIe devices 734 connect to SB/ICH 704 through bus 738 and bus 740. PCI/PCIe devices may include, for example, Ethernet adapters, add-in cards, and PC cards for notebook computers. PCI uses a card bus controller, while PCIe does not. ROM 724 may be, for example, a flash basic input/output system (BIOS).

HDD 726 and CD-ROM drive 730 connect to SB/ICH 704 through bus 740. HDD 726 and CD-ROM drive 730 may use, for example, an integrated drive electronics (IDE) or serial advanced technology attachment (SATA) interface. Super I/O (SIO) device 736 may be connected to SB/ICH 704.

An operating system runs on processing unit 706. The operating system coordinates and provides control of various components within the data processing system 700 in FIG. 7. As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 700 (Java is a trademark of Oracle and/or its affiliates).

As a server, data processing system 700 may be, for example, an IBM® eServer™ System p® computer system, running the Advanced Interactive Executive (AIX®) operating system or the LINUX operating system (IBM, eServer, System p, and AIX are trademarks of International Business Machines Corporation in the United States, other countries, or both, and LINUX is a registered trademark of Linus Torvalds in the United States, other countries, or both). Data processing system 700 may be a symmetric multiprocessor (SMP) system including a plurality of processors in processing unit 706. Alternatively, a single processor system may be employed.

Instructions for the operating system, the object-oriented programming system, and applications or programs are located on storage devices, such as HDD 726, and may be loaded into main memory 708 for execution by processing unit 706. The processes for illustrative embodiments of the present invention may be performed by processing unit 706 using computer usable program code, which may be located in a memory such as, for example, main memory 708, ROM 724, or in one or more peripheral devices 726 and 730, for example.

A bus system, such as bus 738 or bus 740 as shown in FIG. 7, may be comprised of one or more buses. Of course, the bus system may be implemented using any type of communication fabric or architecture that provides for a transfer of data between different components or devices attached to the fabric or architecture. A communication unit, such as modem 722 or network adapter 712 of FIG. 7, may include one or more devices used to transmit and receive data. A memory may be, for example, main memory 708, ROM 724, or a cache such as found in NB/MCH 702 in FIG. 7.

Those of ordinary skill in the art will appreciate that the hardware in FIGS. 6-7 may vary depending on the implementation. Other internal hardware or peripheral devices, such as flash memory, equivalent non-volatile memory, or optical disk drives and the like, may be used in addition to or in place of the hardware depicted in FIGS. 6-7. Also, the processes of the illustrative embodiments may be applied to a multiprocessor data processing system, other than the SMP system mentioned previously, without departing from the spirit and scope of the present invention.

Moreover, the data processing system 700 may take the form of any of a number of different data processing systems including client computing devices, server computing devices, a tablet computer, laptop computer, telephone or other communication device, a personal digital assistant (PDA), or the like. In some illustrative examples, data processing system 700 may be a portable computing device which is configured with flash memory to provide non-volatile memory for storing operating system files and/or user-generated data, for example. Essentially, data processing system 700 may be any known or later developed data processing system without architectural limitation.

Figure 8:
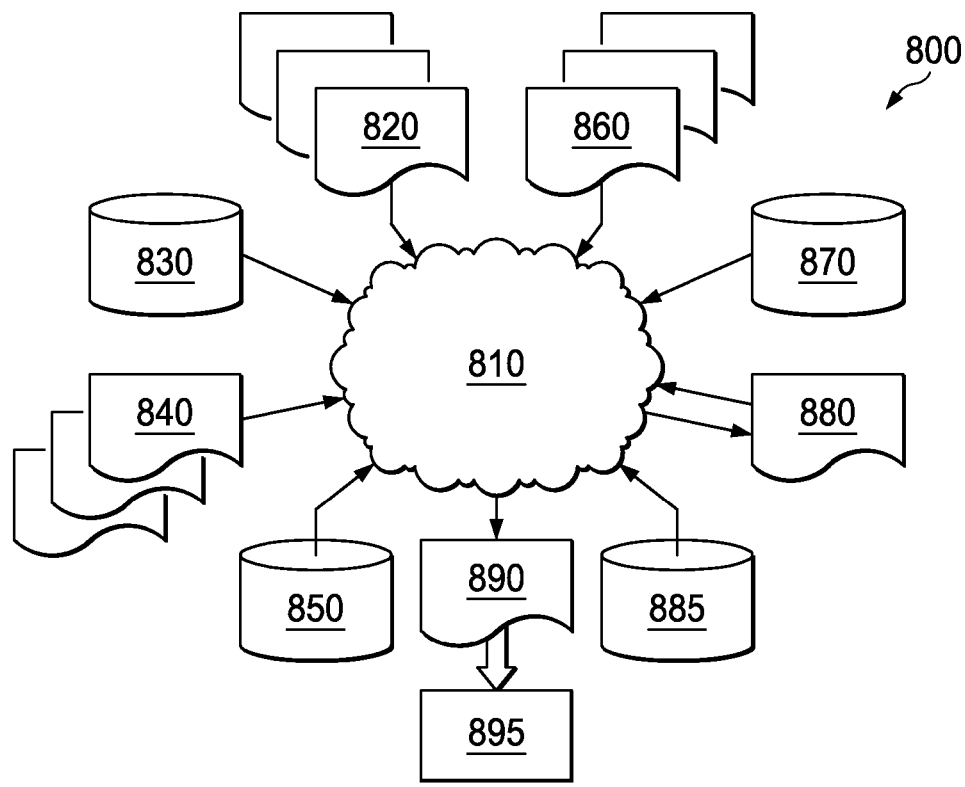
FIG. 8 is a flow diagram of a design process used in semiconductor design, manufacture, and/or test.

FIG. 8 is a flow diagram of a design process used in semiconductor design, manufacture, and/or test in which the mechanism of the illustrative embodiments may be utilized. As shown in FIG. 8, design flow 800 may vary depending on the type of IC being designed. For example, a design flow 800 for building an application specific IC (ASIC) may differ from a design flow 800 for designing a standard component. Design structure 820 is preferably an input to a design process 810 and may come from an IP provider, a core developer, or other design company or may be generated by the operator of the design flow, or from other sources. Design structure 820 may comprise, for example, a logic description 330, timing constraints and other assertions 340, or the like, as shown in FIG. 4 in the form of schematics or HDL, a hardware-description language (e.g., Verilog, VHDL, C, etc.). Design structure 820 may be contained on one or more machine readable medium. For example, design structure 820 may be a text file or a graphical representation of an IC design such as the logic description 330 and timing constraints 340 in FIG. 4.

Design process 810 preferably synthesizes (or translates) the logic description of the IC design into a netlist 880, where netlist 880 is, for example, a list of wires, transistors, logic gates, control circuits, I/O, models, etc. that describes the connections to other elements and circuits in an integrated circuit design and is recorded on at least one of machine readable medium. This may be an iterative process in which netlist 880 is resynthesized one or more times depending on design specifications and parameters for the circuit.

Design process 810 may include using a variety of inputs; for example, inputs from library elements 830, such as cell library 390 in FIG. 4, which may house a set of commonly used elements, circuits, and devices, including models, layouts, and symbolic representations, for a given manufacturing technology (e.g., different technology nodes, 32 nm, 45 nm, 90 nm, etc.), design specifications 840, characterization data 850, verification data 860, design rules 870, and test data files 885 (which may include test patterns and other testing information). Design process 810 may further include, for example, standard circuit design processes such as timing analysis, verification, design rule checking, place and route operations, etc. One of ordinary skill in the art of integrated circuit design can appreciate the extent of possible electronic design automation tools and applications used in design process 810 without deviating from the scope and spirit of the invention.

Design process 810 preferably implements the mechanisms of the illustrative embodiments, such as shown in FIGS. 4 and 5 above, to translate a logic description of an IC design, along with any additional integrated circuit design or data (if applicable), into a second design structure 890. Design structure 890 resides on a storage medium in a data format used for the exchange of layout data of integrated circuits (e.g. information stored in a GDSII (GDS2), GL1, OASIS, or any other suitable format for storing such design structures). Design structure 890 may comprise information such as, for example, test data files, design content files, manufacturing data, layout parameters, wires, levels of metal, vias, shapes, data for routing through the manufacturing line, and any other data required by a semiconductor manufacturer to produce an IC device corresponding to the logic description of the IC design. Design structure 890 may then proceed to a stage 895 where, for example, design structure 890 proceeds to tape-out, is released to manufacturing, is released to a mask house, is sent to another design house, is sent back to the customer, etc.

The mechanisms described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for generating a physical layout of an integrated circuit design, comprising:
   receiving, by the data processing system, a logic description of the integrated circuit design, wherein the logic description comprises a first logic description of control logic comprised within an irregular logic block of the integrated circuit design and a second logic description of data path logic comprised within a regular logic block of the integrated circuit design;
   performing, in the data processing system, manual design of the data path logic comprised within the regular logic block of the integrated circuit design based on user input;
   performing, in the data processing system, automated design of the control logic comprised within the irregular logic block of the integrated circuit design without user input; and
   integrating, by the data processing system, the manual design of the data path logic comprised within the regular logic block and the automated design of the control logic comprised within the irregular logic block into the integrated circuit design to generate a hybrid integrated circuit design.

2. The method of claim 1, wherein performing manual design of the data path logic comprised within the regular logic block comprises:
   generating a physical layout and an abstract for the integrated circuit design with the exception of the control logic comprised within the irregular logic block; and
   generating a physical layout of the data path logic comprised within the regular logic block in the physical layout of the integrated circuit. design using user input to generate the physical layout of the data path logic.

3. The method of claim 2, wherein performing automated design of the control logic comprised within the irregular logic block comprises;
   generating an abstract of the control logic comprised within the irregular logic block without generating a physical layout of the control logic comprised within the irregular logic block;
   providing the abstract of the control logic comprised within the irregular logic block to an automated control logic block synthesis and layout engine of the data processing system; and
   performing automated control logic block synthesis and layout of the control logic comprised within the irregular logic block based on the abstract of the control logic comprised within the irregular logic block to generate a physical layout of the control logic comprised within the irregular logic block.

4. The method of claim 3, wherein automatically integrating the manual design of the data path logic comprised within the regular logic block and the automated design of the control logic comprised within the irregular logic block into the integrated circuit design to generate a hybrid integrated circuit design comprises:
   automatically inserting the physical layout of the control logic comprised within the irregular logic block in the physical layout of the integrated circuit design to generate a hybrid integrated circuit design physical layout.

5. The method of claim 1, wherein the logic description of the integrated circuit design is a very high speed integrated circuit hardware description language (VHDL) model of the integrated circuit design that is composed of a set of subcomponents corresponding to the data path logic comprised within the regular logic and the control logic comprised within the irregular logic.

6. The method of claim 1, further comprising:
   performing a timing analysis of the hybrid integrated circuit design physical layout based on default timing constraint values;
   determining a difference between the timing constraint values and actual timing values obtained from the timing analysis;
   updating the default timing constraint values to be actual timing constraint values based on the different between the timing constraint values and the actual timing values; and
   performing a synthesis of the hybrid integrated circuit design using the actual timing constraint values.

7. The method of claim 1, further comprising:
fabricating the integrated circuit design as an integrated circuit device based on hybrid integrated circuit design.

8. A computer program product comprising a computer readable storage medium having a computer readable program stored therein, wherein the computer readable program, when executed on a data processing system, causes the data processing system to:
receive a logic description of an integrated circuit design, wherein the logic description comprises a first logic description of control logic comprised within an irregular logic block of the integrated circuit design and a second logic description of d a path logic comprised within a regular logic block of the integrated circuit design;
perform manual design of the regular logic block of the data path logic comprised within the integrated circuit design based on user input;
perform automated design of the irregular logic block of the control logic comprised within the integrated circuit design without user input; and
integrate the manual design of the data path logic comprised within the regular logic block and the automated design of the control logic comprised within the irregular logic block into the integrated circuit design to generate a hybrid integrated circuit design.

9. The computer program product of claim 8, wherein the computer readable program causes the data processing system to perform manual design of the data path logic comprised within the regular logic block by:
generating a physical layout and an abstract for the integrated circuit design with the exception of the control logic comprised within the irregular logic block; and
generating a physical layout of the data path logic comprised within the regular logic block in the physical layout of the integrated circuit design using user input to generate the physical layout of the data path logic.

10. The computer program product claim 9, wherein the computer readable program causes the data processing system to perform automated design of the irregular logic block by:
generating an abstract of the control logic comprised within the irregular logic block without generating a physical layout of the control logic comprised within the irregular logic block;
providing the abstract of the control logic comprised within the irregular logic block to an automated control logic block synthesis and layout engine of the data processing system; and
performing automated control logic block synthesis and layout of the control logic comprised within the irregular logic block based on the abstract of the control logic comprised within the irregular logic block to generate a physical layout of the control logic comprised within the irregular logic block.

11. The computer program product of claim 10, wherein automatically integrating the manual design of the data path logic comprised within the regular logic block and the automated design of the control logic comprised within the irregular logic block into the integrated circuit design to generate a hybrid integrated circuit design comprises:
automatically inserting the physical layout of the control logic comprised within the irregular logic block in the physical layout of the integrated circuit design to generate a hybrid integrated circuit design physical layout 12. The computer program product of claim 8, wherein the logic description of the integrated circuit design is a very high speed integrated circuit hardware description language (VHDL) model of the integrated circuit design that is composed of a set of sub-components corresponding to the data path logic comprised within the regular logic and the control logic comprised within the irregular logic.

13. The computer program product of claim 8, wherein the computer readable program further causes the data processing system to
perform a timing analysis of the hybrid integrated circuit design physical layout based on default timing constraint values;
determine a difference between the timing constraint values and actual timing values obtained from the timing analysis;
update the default timing constraint values to be actual timing constraint values based on the different between the timing constraint values and the actual timing values; and
perform a synthesis of he hybrid integrated circuit design, using the actual timing constraint values.

14. The computer program product of claim 8, wherein the computer readable program further causes the data processing system to:
fabricate the integrated circuit design as an integrated circuit device based hybrid integrated circuit design.

15. An apparatus, comprising:
a processor; and
a memory coupled to the processor, wherein the memory comprises instructions which, when, executed by the processor, cause the processor to:
receive a logic description of an integrated circuit design, wherein the logic description comprises a first logic description of control logic comprised within an irregular logic block of the integrated circuit design and a second logic description of data path logic comprised within a regular logic block of the integrated circuit design;
perform manual design of the data path logic comprised within the regular logic block of the integrated circuit design based on user input;
perform automated design of the control logic comprised within the irregular logic block of the integrated circuit design without user input; and
integrate the manual design of the data path logic comprised within the regular logic block and the automated design of the control logic comprised within the irregular logic block into the integrated circuit design to generate a hybrid integrated circuit design.

16. The apparatus of claim 15, wherein the computer readable program causes the data processing system to perform manual design of the data path logic comprised within the regular logic block by:
generating a physical layout and an abstract for the integrated circuit design with the exception of the control logic comprised within the irregular logic block; and
generating a physical layout of the data path logic comprised within the regular logic block in the physical layout of the integrated circuit design using user input to generate the physical layout of the data path logic.

17. The apparatus of claim 16, wherein the computer readable program causes the data processing system to perform automated design of the control logic comprised within the irregular logic block by:
generating an abstract of the control logic comprised within the irregular logic block without generating a physical layout of the control logic comprised within the irregular logic block;

providing the abstract of the control logic comprised within the, irregular logic block to an automated control logic block synthesis and layout engine of the data processing system; and performing automatic control logic block synthesis and layout of the control logic comprised within the irregular logic block based on the abstract of the control logic comprised within the irregular logic block to generate a physical layout of the control logic comprised within the irregular logic-block.

18. The apparatus of claim 17, wherein automatically integrating the manual design of the data path logic comprised within the regular logic block and the automated design of the control logic comprised within the irregular logic block into the integrated circuit design to generate a hybrid integrated circuit design comprises;

automatic inserting the physical layout of the control logic comprised within the irregular logic block in the physical layout of the integrated circuit design to generate a hybrid integrated circuit design physical layout.

19. The apparatus of claim 15, wherein the logic description of the integrated circuit design is a very high speed integrated circuit hardware description language (VHDL) model of the integrated circuit design that is composed of a set of sub-components components corresponding to the data path logic comprised within the regular logic and the control logic comprised within the irregular logic.

20. The apparatus of claim 15, wherein the computer readable program further causes the data processing system to:

perform a timing analysis of the hybrid integrated circuit design physical layout based on default timing constraint values;

determine a difference between the timing constraint values and actual timing values obtained from the timing analysis;

update the default timing constraint values to be actual timing constraint values based on the different between the timing constraint values and the actual timing values; and perform a synthesis of the hybrid integrated circuit design using the actual timing constraint values.

21. The apparatus of claim 15, wherein the computer readable program further causes the data processing system to:

fabricate the integrated circuit design as an integrated circuit device based on hybrid integrated circuit design.

* * * * *